United States Patent
Tanabe et al.

(10) Patent No.: US 9,255,958 B2
(45) Date of Patent: Feb. 9, 2016

(54) GROUND FAULT DETECTION CIRCUIT

(75) Inventors: Tomoaki Tanabe, Minato-ku (JP); Toyohiko Kiyohara, Minato-ku (JP)

(73) Assignee: TOSHIBA MITSUBISHI-ELECTRIC INDUSTRIAL SYSTEMS CORPORATION, Tokyo (JP)

(*) Notice: Subject to any disclaimer, the term of this patent is extended or adjusted under 35 U.S.C. 154(b) by 285 days.

(21) Appl. No.: 13/994,456

(22) PCT Filed: Mar. 24, 2011

(86) PCT No.: PCT/JP2011/057211
§ 371 (c)(1),
(2), (4) Date: Jun. 14, 2013

(87) PCT Pub. No.: WO2012/127686
PCT Pub. Date: Sep. 27, 2012

(65) Prior Publication Data
US 2013/0285669 A1 Oct. 31, 2013

(51) Int. Cl.
G01R 31/14 (2006.01)
G01R 31/08 (2006.01)
G01R 31/02 (2006.01)

(52) U.S. Cl.
CPC ............ G01R 31/08 (2013.01); G01R 31/025 (2013.01)

(58) Field of Classification Search
CPC ........ G01R 31/25; G01R 31/41; G01R 31/26; G01R 27/18; B60L 3/0069
See application file for complete search history.

(56) References Cited

U.S. PATENT DOCUMENTS

| | | | | |
|---|---|---|---|---|
| 2,980,898 | A * | 4/1961 | Mason et al. | 340/505 |
| 3,699,392 | A * | 10/1972 | Lee et al. | 361/49 |
| 3,801,871 | A | 4/1974 | Loh | |
| 4,159,499 | A * | 6/1979 | Bereskin | 361/42 |
| 4,371,832 | A * | 2/1983 | Wilson et al. | 324/509 |
| 4,809,123 | A * | 2/1989 | Allington et al. | 361/42 |
| 5,363,047 | A * | 11/1994 | Dresti et al. | 324/510 |
| 5,680,286 | A * | 10/1997 | Pacholok | 361/42 |
| 6,188,553 | B1 * | 2/2001 | Moisin | 361/52 |
| 6,421,214 | B1 * | 7/2002 | Packard et al. | 361/7 |
| 2002/0017893 | A1 | 2/2002 | Duff, Jr. | |
| 2005/0035729 | A1 | 2/2005 | Lev et al. | |

(Continued)

FOREIGN PATENT DOCUMENTS

| | | |
|---|---|---|
| CN | 1311441 A | 9/2001 |
| CN | 1696722 A | 11/2005 |
| JP | 58 18173 | 2/1983 |

(Continued)

OTHER PUBLICATIONS

Office Action issued Feb. 3, 2015 in Japanese Patent Application No. 2013-505752 (with English language translation).

(Continued)

*Primary Examiner* — Tung X Nguyen
*Assistant Examiner* — Dominic Hawkins
(74) *Attorney, Agent, or Firm* — Oblon, McClelland, Maier & Neustadt, L.L.P.

(57) ABSTRACT

A ground fault detection circuit includes an AC power supply and a plurality of resonance circuits. The plurality of resonance circuits are connected between at least one current path formed of a plurality of loads and the AC power supply. Each of the plurality of resonance circuits has the same resonance frequency as the frequency of the AC power supply.

6 Claims, 19 Drawing Sheets

(56) References Cited

U.S. PATENT DOCUMENTS

2005/0163308 A1* 7/2005 Smith et al. .............. 379/395.01
2010/0244849 A1* 9/2010 Yano et al. .................... 324/510

FOREIGN PATENT DOCUMENTS

| | | |
|---|---|---|
| JP | 58 175922 | 10/1983 |
| JP | 62 01017 | 1/1987 |
| JP | 1-185132 A | 7/1989 |
| JP | 8 122395 | 5/1996 |
| JP | 9 163590 | 6/1997 |
| TW | 506173 B | 10/2002 |

OTHER PUBLICATIONS

Combined Chinese Office Action and Search Report issued Sep. 28, 2014 in Patent Application No. 201180067372.0 with English Translation and English Translation of Category of Cited Documents.
Combined Taiwanese Office Action and Search Report issued Jul. 3, 2013 in Patent Application No. 100117730 (with English language translation).
International Search Report Issued Jun. 7, 2011 in PCT/JP11/57211 Filed Mar. 24, 2011.

* cited by examiner

GROUND FAULT DETECTION CIRCUIT

TECHNICAL FIELD

The present invention relates to a ground fault detection circuit.

BACKGROUND ART

For example, Japanese Patent Laying-Open No. 62-1017 (PTD 1) discloses a heating power supply device for heating a negative resistance load. This power supply device includes a power supply transformer and a plurality of thyristor rectifiers connected to the power supply transformer. A load is connected to each of the thyristor rectifiers. The power supply device further includes a semiconductor switch for connecting a plurality of loads to at least one of the plurality of thyristor rectifiers in series, in parallel, or in series-parallel combination.

Furthermore, the configuration for detecting a ground fault in the load connected to the power supply device has also been proposed. For example, Japanese Patent Laying-Open No. 58-175922 (PTD 2) discloses a semiconductor power conversion system having the following configuration. Specifically, the semiconductor power conversion system includes a series path formed of an alternating-current (AC) power supply that supplies an AC output having a frequency different from an output frequency of a semiconductor power conversion device, an element for series resonance that has a frequency of this AC power supply as a resonance frequency, and an impedance element for monitoring a ground current. The series path is interposed between the load of the semiconductor power conversion device and a ground.

CITATION LIST

Patent Document

PTD 1: Japanese Patent Laying-Open No. 62-1017
PTD 2: Japanese Patent Laying-Open No. 58-175922

SUMMARY OF INVENTION

Technical Problem

According to the configuration disclosed in Japanese Patent Laying-Open No. 58-175922 (PTD 2), a ground fault detection circuit is provided for each load. Accordingly, it is considered possible to identify the position where a ground fault occurs. In this case, however, the configuration of the ground fault detection circuit becomes complicated.

An object of the present invention is to provide a ground fault detection circuit capable of detecting the position of a ground fault in a simple configuration.

Solution to Problem

In short, the present invention provides a ground fault detection circuit for detecting a ground fault in a plurality of loads each connected to a power supply device. The ground fault detection circuit includes an AC power supply and a plurality of resonance circuits. The plurality of resonance circuits are connected between at least one current path formed of a plurality of loads and the AC power supply. Each of the plurality of resonance circuits has a resonance frequency equal to a frequency of the AC power supply.

Advantageous Effects of Invention

According to the present invention, a ground fault occurring in one of a plurality of loads can be detected in a simple configuration.

DESCRIPTION OF EMBODIMENTS

Figure 1:
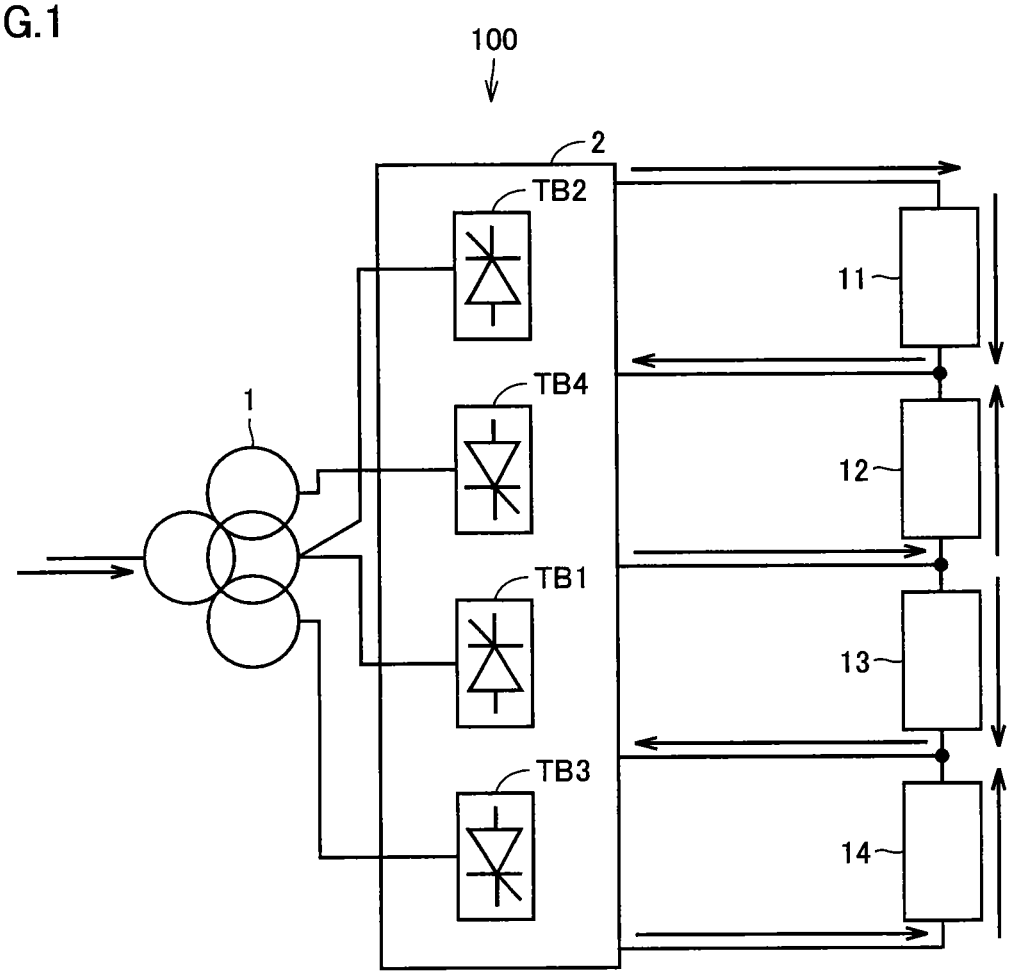
FIG. 1 is a diagram schematically showing an example of a power supply device to which a ground fault detection circuit according to an embodiment of the present invention is applied.

Embodiments of the present invention will be hereinafter described in detail with reference to the accompanying drawings, in which the same or corresponding components are designated by the same reference characters, and description thereof will not be repeated.

FIG. 1 is a diagram schematically showing an example of a power supply device to which a ground fault detection circuit according to an embodiment of the present invention is applied. Referring to FIG. 1, a power supply device 100 includes a transformer 1 and a rectifier 2. Rectifier 2 includes thyristor rectifier circuits TB1 to TB4. Loads 11 to 14 are connected to rectifier 2.

Transformer 1 receives AC power from a system. Rectifier 2 converts the AC power from transformer 1 into a direct-current (DC) power and supplies the DC power to loads 11 to 14. Arrows in FIG. 1 each show the direction in which a current flows.

For example, loads 11 to 14 each have a negative resistance. By way of example, loads 11 to 14 each are a polycrystalline silicon load. Loads 11 to 14 are heated by the DC power supplied from rectifier 2. The type of the load is not limited to the above.

Figure 2:
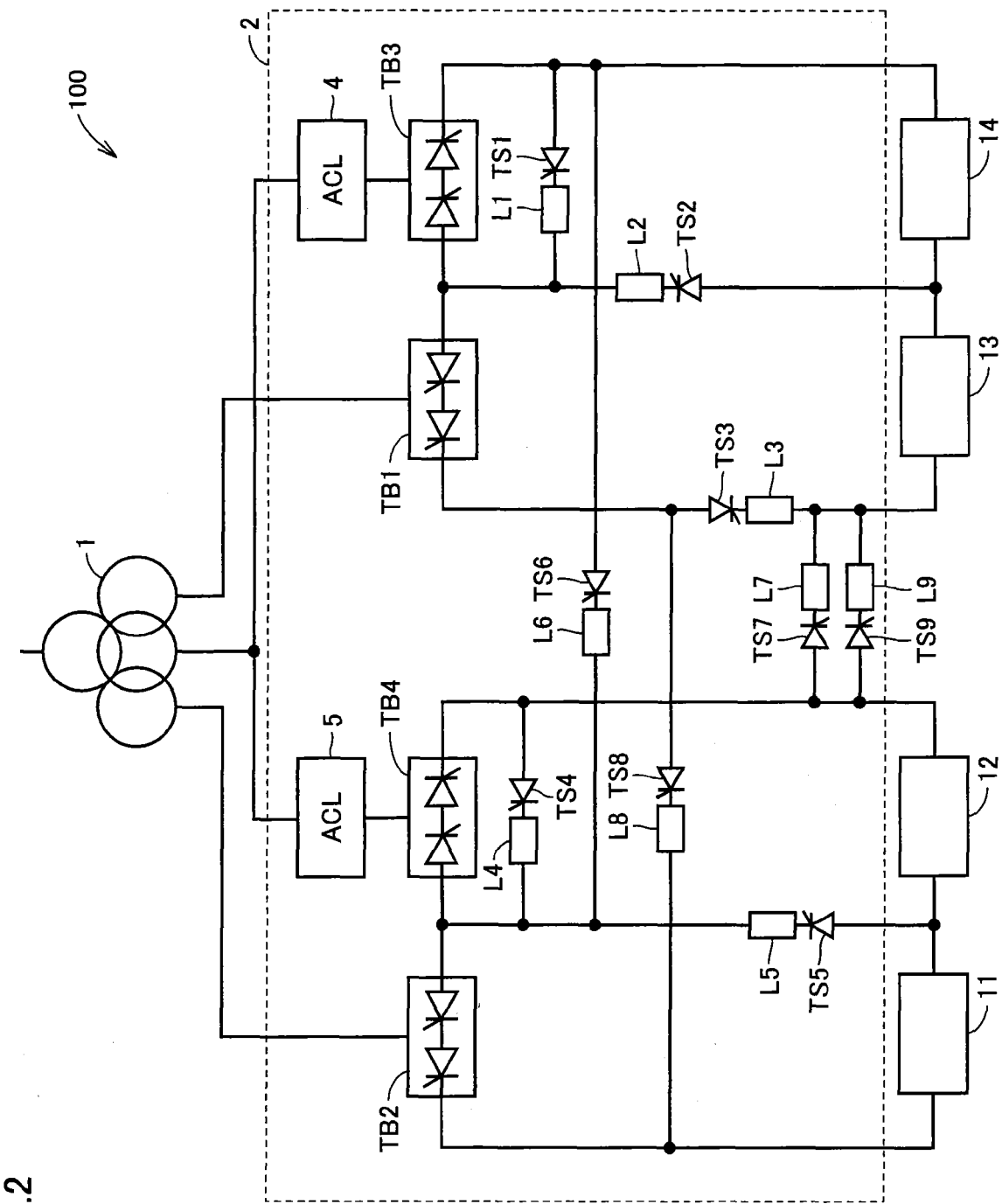
FIG. 2 is a diagram showing a detailed configuration of the power supply device shown in FIG. 1.

FIG. 2 is a diagram showing a detailed configuration of the power supply device shown in FIG. 1. Referring to FIG. 2, rectifier 2 includes thyristor rectifier circuits TB1 to TB4, thyristor switches TS1 to TS9, current limiting circuits (shown as ACL in FIGS. 2) 4 and 5, and saturable reactors L1 to L9.

Transformer 1 is a three-phase four-wire type transformer. Thyristor rectifier circuits TB1 to TB4 are connected to the secondary winding of transformer 1. Thyristor rectifier circuits TB1 to TB4 each are a six-phase thyristor rectifier circuit. In the configuration shown in FIG. 2, thyristor rectifier circuits TB1 and TB2 are directly connected to the secondary winding of transformer 1. On the other hand, thyristor rectifier circuits TB3 and TB4 are connected through current limiting circuits 4 and 5, respectively, to the secondary winding of transformer 1.

Loads 11 to 14 are connected to thyristor rectifier circuits TB2, TB4, TB1, and TB3, respectively. Thyristor switches TS1 to TS9 are disposed in a circuit (lines) connecting thyristor rectifier circuits TB1 to TB4 and loads 11 to 14. Saturable reactors L1 to L9 are disposed corresponding to their respective thyristor switches TS1 to TS9. Saturable reactors L1 to L9 are connected in series to their respective thyristor switches.

Then, the operation of power supply device 100 shown in FIG. 2 will be hereinafter described. Power supply device 100 has three modes (mode A, mode B and mode C). One of these three modes is selected in accordance with the magnitude of the load. Thyristor switches TS1 to TS9 each switch the mode of connection of the plurality of loads to at least one thyristor rectifier circuit among mode A, mode B and mode C.

(Mode A)

Figure 3:
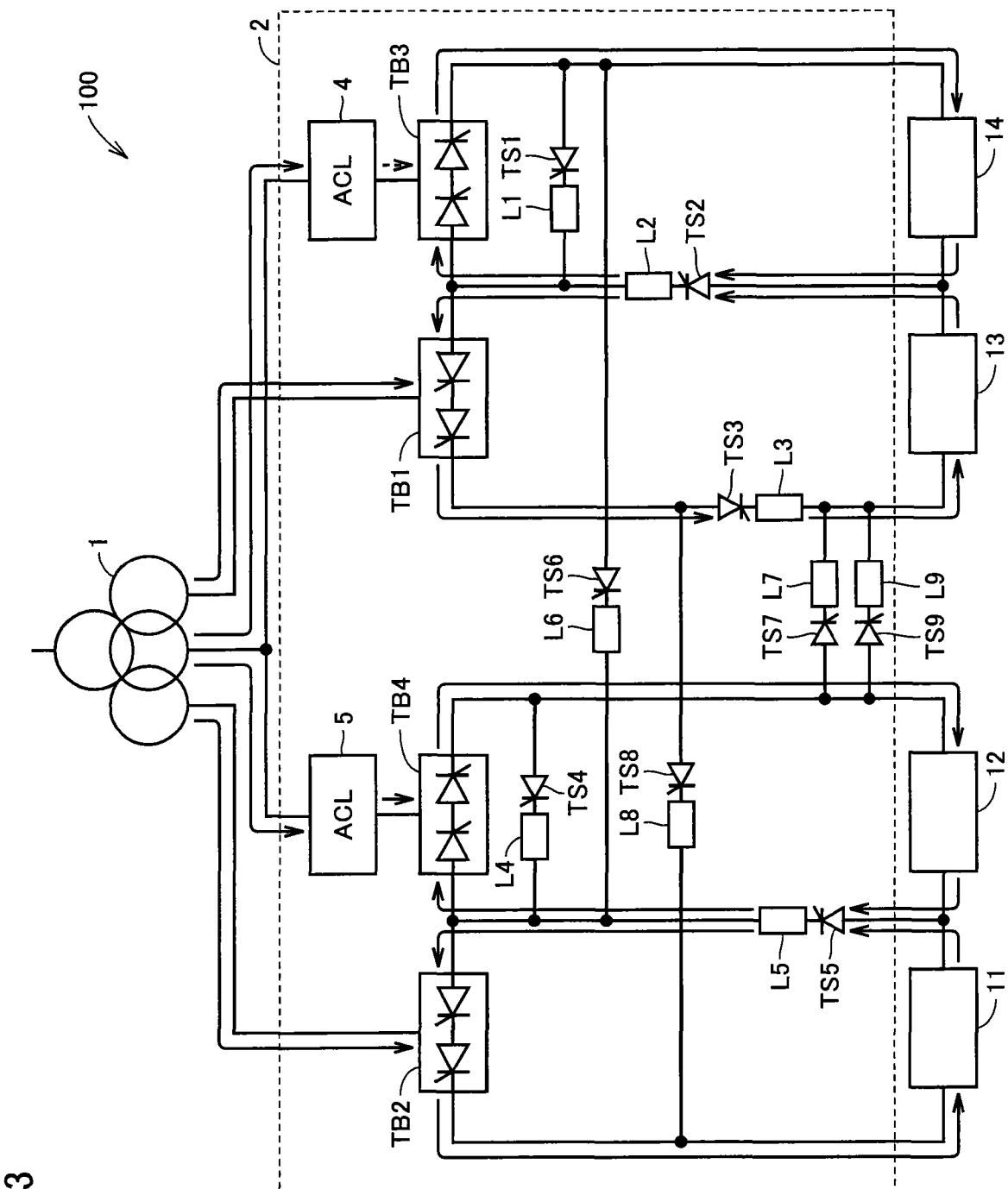
FIG. 3 is a diagram illustrating an operation of the power supply device in a mode A.
Figure 4:
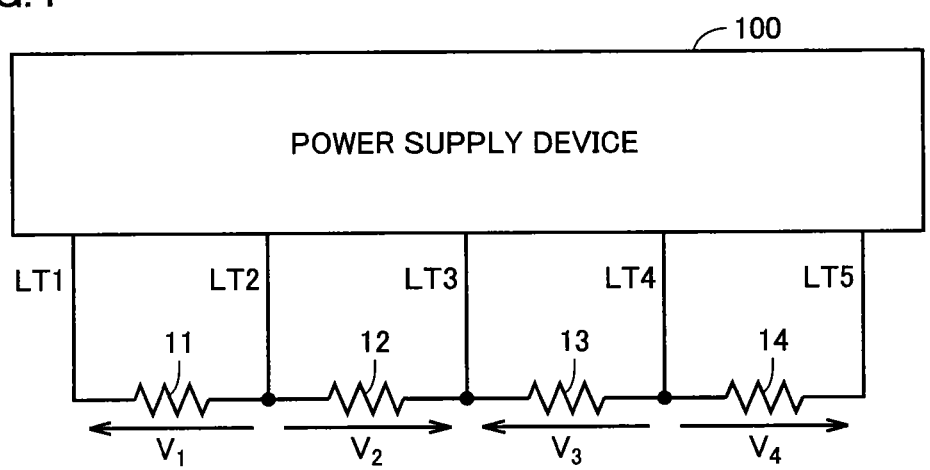
FIG. 4 is a diagram for illustrating a voltage applied to each load in mode A.

FIG. 3 is a diagram illustrating the operation of the power supply device in mode A. FIG. 4 is a diagram for illustrating a voltage applied to each load in mode A. Referring to FIGS. 3 and 4, in mode A, all of thyristor rectifier circuits TB1 to TB4 and thyristor switches TS2, TS3 and TS5 are brought into an ON state. In this mode, loads 11, 12, 13, and 14 are connected to thyristor rectifier circuits TB2, TB4, TB1, and TB3, respectively. Accordingly, the current flowing through loads 11 to 14 is as shown by arrows in FIG. 3. As shown in FIG. 4, voltages $V_1$, $V_2$, $V_3$, and $V_4$ are applied to loads 11 to 14, respectively. Reference numerals LT1 to LT5 in FIG. 4 show interconnections connected to loads 11 to 14.

(Mode B)

Figure 5:
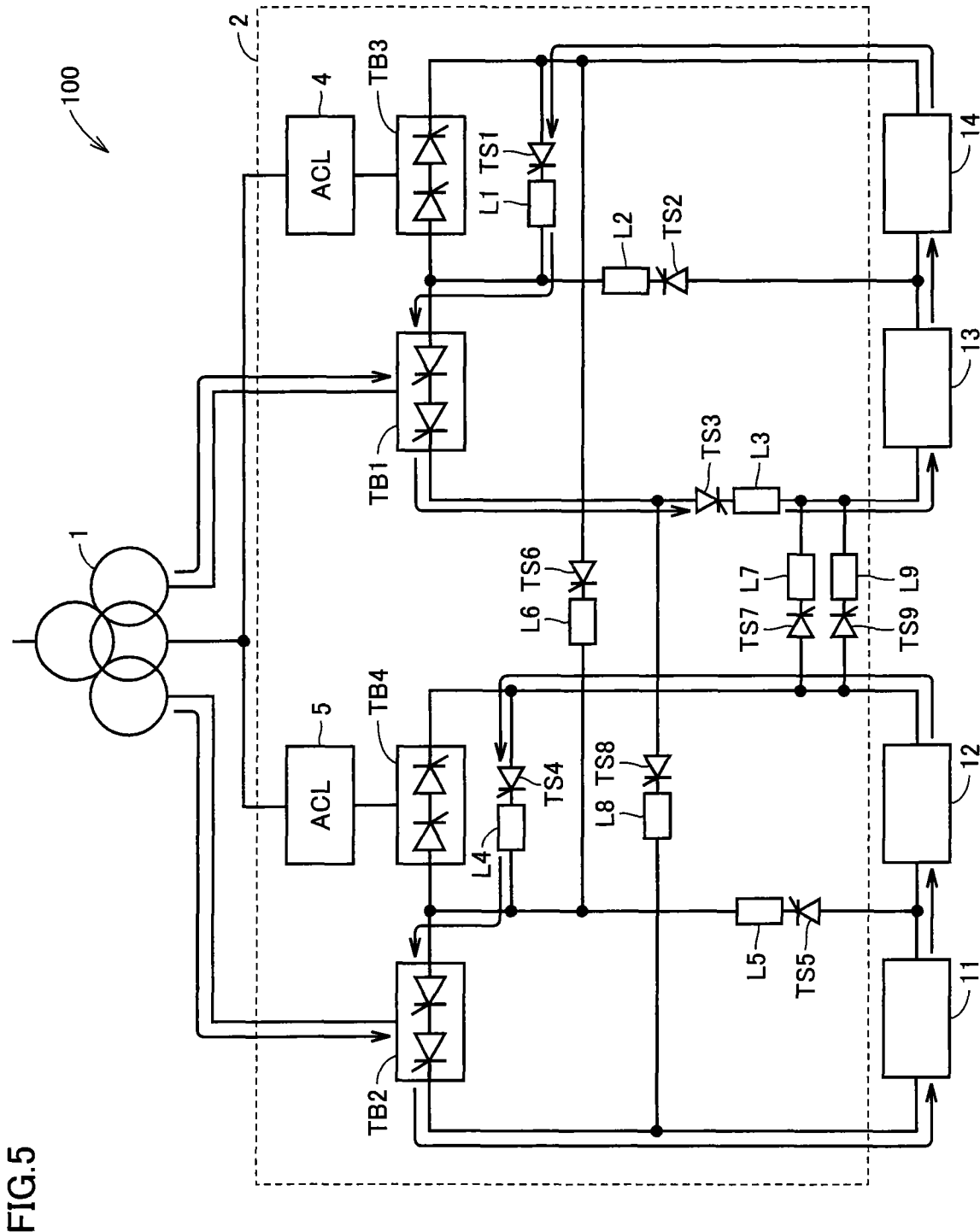
FIG. 5 is a diagram illustrating the operation of the power supply device in a mode B.
Figure 6:
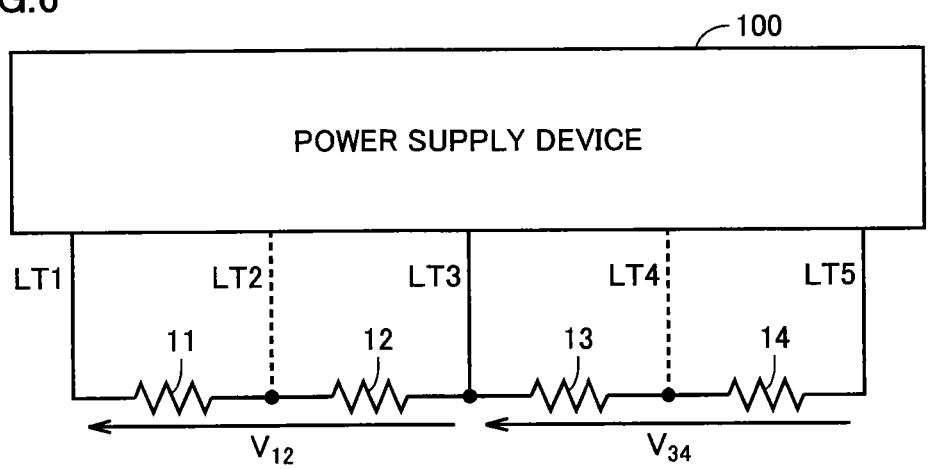
FIG. 6 is a diagram for illustrating a voltage applied to each load in mode B.

FIG. 5 is a diagram illustrating the operation of the power supply device in mode B. FIG. 6 is a diagram for illustrating a voltage applied to each load in mode B. Referring to FIGS. 5 and 6, in mode B, thyristor rectifier circuits TB1 and TB2 and thyristor switches TS1, TS3 and TS4 are brought into an ON state. In this mode, loads 11 and 12 are connected in series to thyristor rectifier circuit TB2 while loads 13 and 14 are connected in series to thyristor rectifier circuit TB1. Accordingly, loads 11 to 14 each are connected in series and parallel to at least one thyristor rectifier circuit.

The current flowing through loads 11 to 14 is shown by arrows in FIG. 5. As shown in FIG. 6, a voltage $V_{12}$ is applied to loads 11 and 12 while a voltage $V_{34}$ is applied to loads 13 and 14.

(Mode C)

Figure 7:
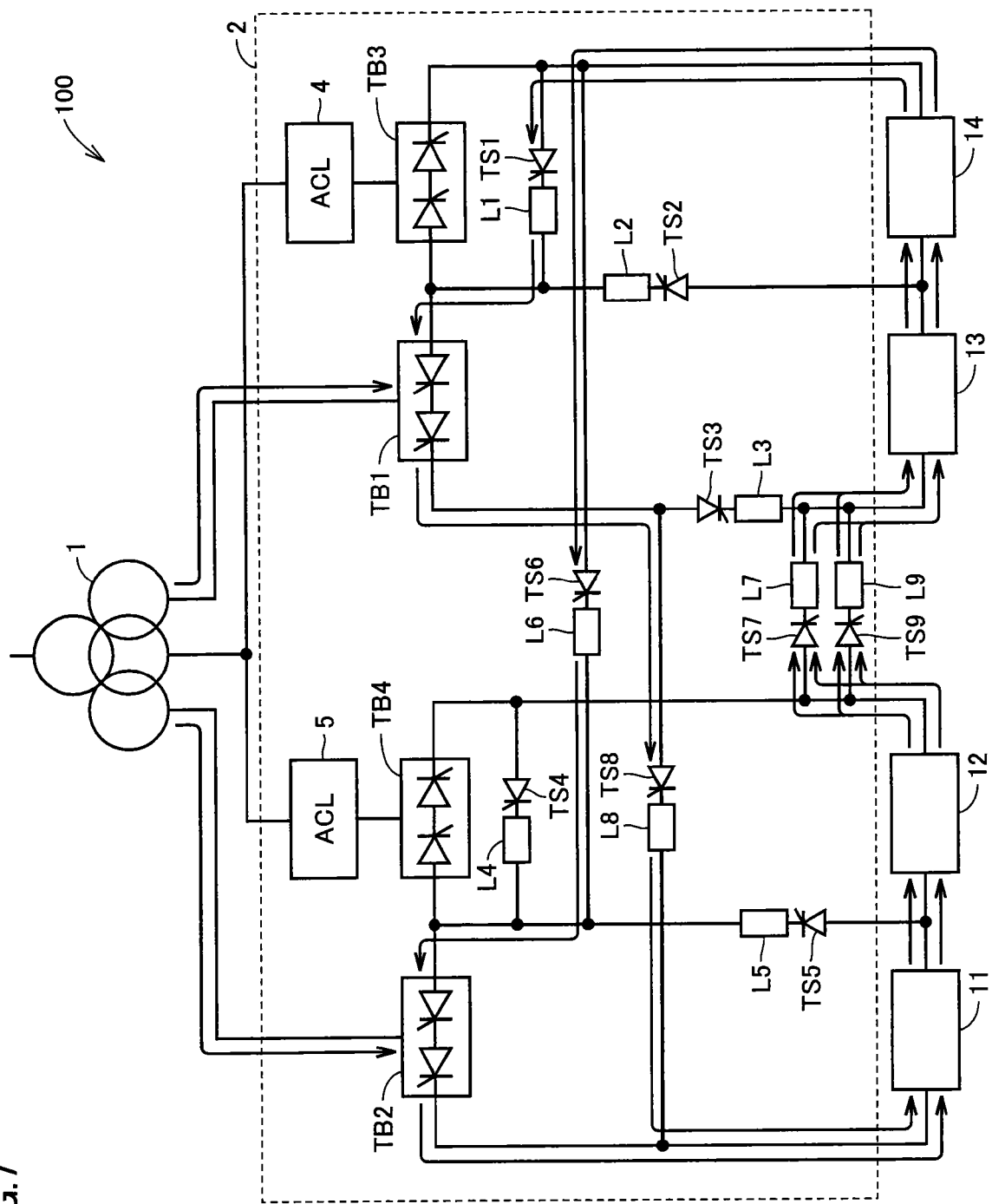
FIG. 7 is a diagram illustrating the operation of the power supply device in a mode C.
Figure 8:
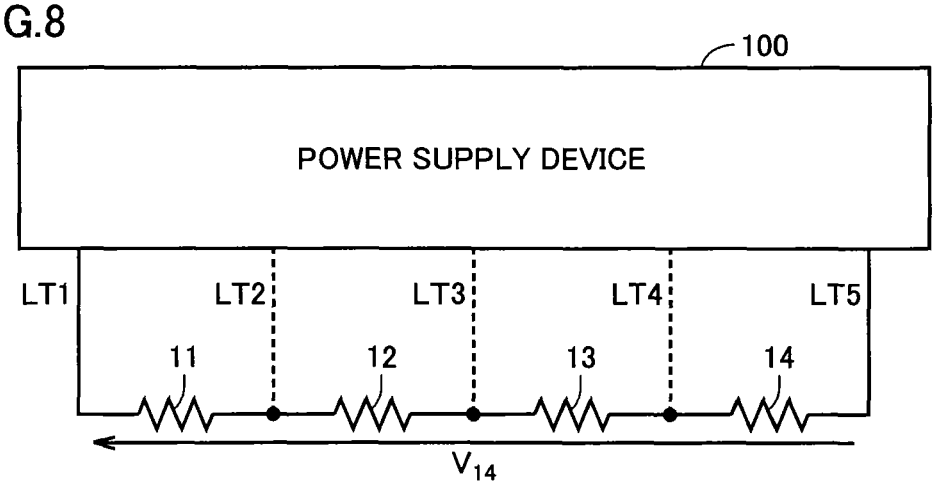
FIG. 8 is a diagram for illustrating a voltage applied to each load in mode C.

FIG. 7 is a diagram illustrating the operation of the power supply device in mode C. FIG. 8 is a diagram for illustrating a voltage applied to each load in mode C. Referring to FIGS. 7 and 8, in mode C, thyristor rectifier circuits TB1 and TB2 and thyristor switches TS1, TS6, TS7, TS8, and TS9 are brought into an ON state. In this mode, loads 11, 12, 13, and 14 are connected in series to thyristor rectifier circuit TB1 or TB2. Accordingly, the current flowing through loads 11 to 14 is as shown by arrows in FIG. 7. As shown in FIG. 8, a voltage $V_{14}$ is applied to loads 11, 12, 13, and 14.

Loads 11 to 14 each have a negative resistance. Accordingly, a high voltage and a small current are required in the early stage of energization. On the other hand, a low voltage and a large current are required in the last stage of energization. Loads 11 to 14 are connected in parallel in the early stage of energization, and connected in series in the last stage thereof. Consequently, the magnitudes of the loads to transformer 1 can be made approximately constant. For the reasons as set forth above, mode A is selected in the early stage of energization. The resistance value of the load is decreased by growth of polycrystalline silicon. This causes the mode of power supply device 100 to be switched sequentially from mode A to mode B and further to mode C. In mode B, two loads are connected in series to each of two thyristor rectifier circuits. Consequently, the DC output voltage of each of thyristor rectifier circuits TB1 and TB2 becomes twice as high as the DC output voltage in mode A, so that the power factor is improved.

When the resistance values of loads 11 to 14 are further decreased in mode B, the DC voltage is decreased, thereby deteriorating the power factor. When the power factor reaches a prescribed value, the mode of power supply device 100 is switched from mode B to mode C. Since loads 11 to 14 are connected in series in mode C, the output DC voltage of each of thyristor rectifier circuits TB1 and TB2 becomes twice as high as the DC output voltage in mode B. Consequently, the power factor is improved. Furthermore, thyristor rectifier circuits TB1 and TB2 are operated in parallel, so that the current twice as large as the current in mode B can be caused to flow through loads 11 to 14.

[Ground Fault Detection Circuit]

Figure 9:
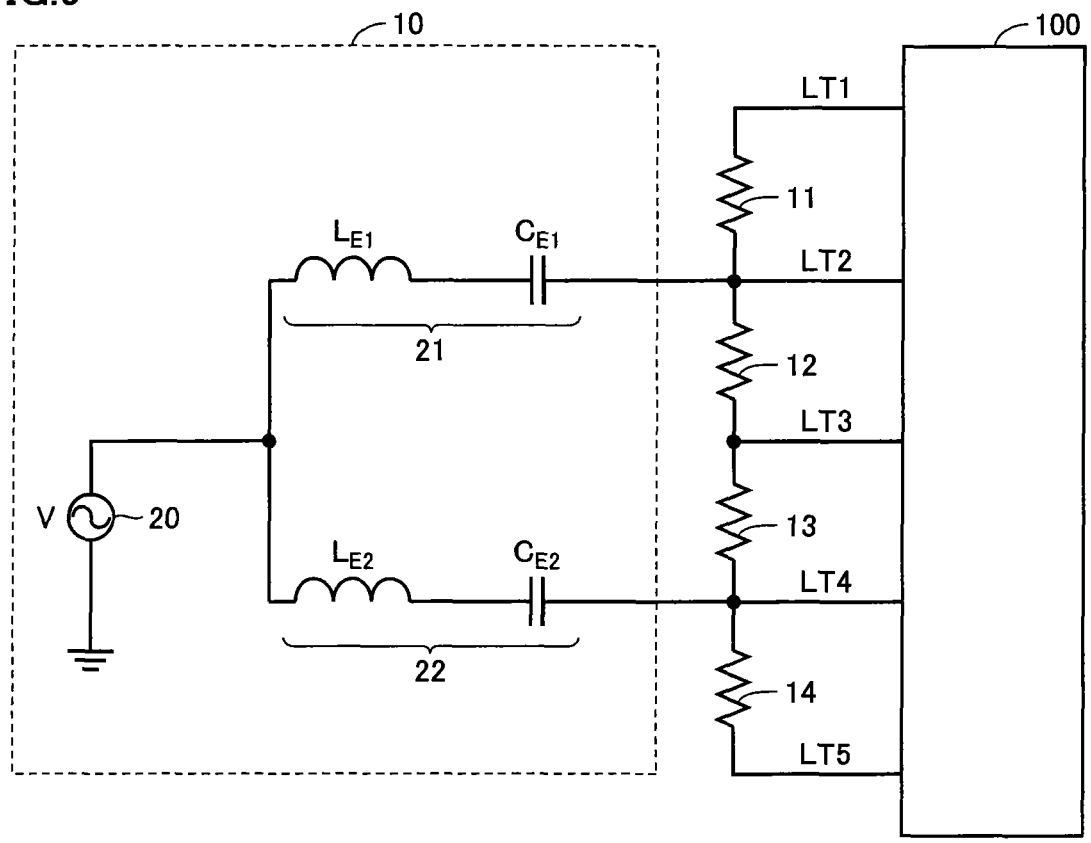
FIG. 9 is a diagram showing a basic configuration of a ground fault detection circuit according to the embodiment of the present invention.

FIG. 9 is a diagram showing the basic configuration of the ground fault detection circuit according to the embodiment of the present invention. Referring to FIG. 9, a ground fault detection circuit 10 detects that a ground fault occurs in any of loads 11 to 14. Ground fault detection circuit 10 includes an AC power supply 20 generating an AC voltage V, and resonance circuits 21 and 22.

Each of resonance circuits 21 and 22 is provided between a current path formed of loads 11 to 14 and AC power supply 20. Specifically, resonance circuit 21 includes an inductor $L_{E1}$ and a capacitor $C_{E1}$ connected in series between AC power supply 20 and load interconnection LT2. Resonance circuit 22 includes an inductor $L_{E2}$ and a capacitor $C_{E2}$ connected in series between AC power supply 20 and load interconnection LT4.

Figure 10:
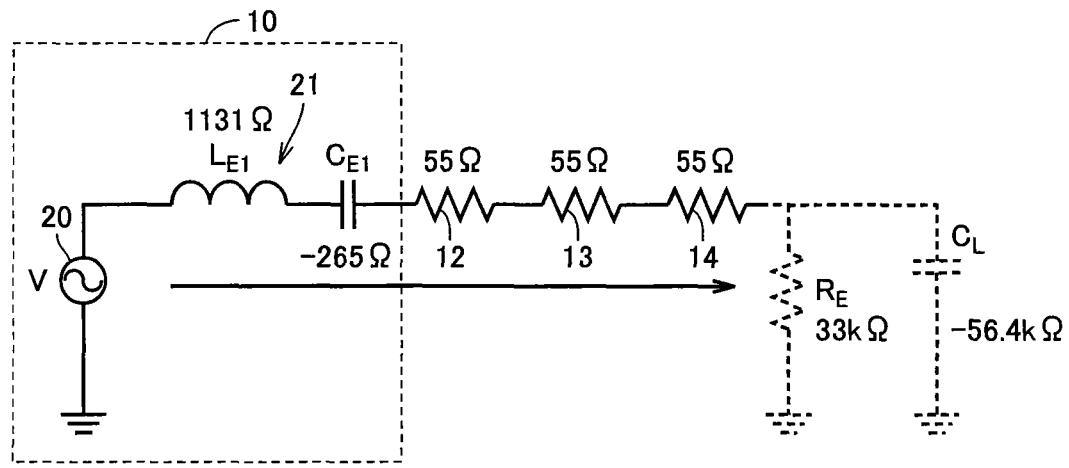
FIG. 10 is a circuit diagram equivalently showing a resonance circuit in the state where a ground fault does not occur in any of a plurality of load interconnections.
Figure 11:
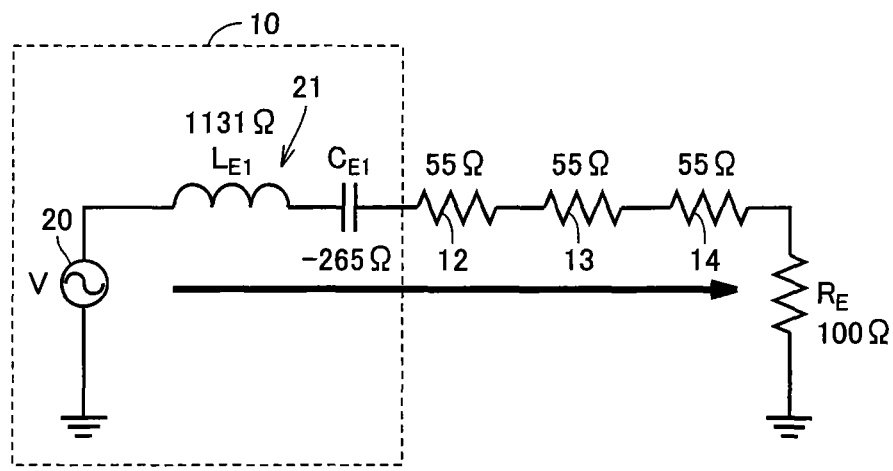
FIG. 11 is a circuit diagram equivalently showing the resonance circuit in the state where a ground fault occurs in a load interconnection LT5.

Then, by representatively showing resonance circuit 21, the basic operation of ground fault detection circuit 10 will be hereinafter described. FIG. 10 is a circuit diagram equivalently showing the resonance circuit in the state where a ground fault does not occur in any of a plurality of load interconnections. FIG. 11 is a circuit diagram equivalently showing the resonance circuit in the state where a ground fault occurs in load interconnection LT5. Referring to FIGS. 10 and 11, the frequency of AC voltage V is 60 Hz. The resistance value of each of loads 12 to 14 is 55Ω; the capacitance value of capacitor $C_{E1}$ is 10 μF; the inductance value of inductor $L_{E1}$ is 3 H; the value of the insulation resistance to the ground is 33 kΩ; the capacitance value of a floating capacitor $C_L$ existing between the load interconnection and the ground is 0.047 μF; and the resistance value of an insulation resistance $R_E$ between the load interconnection and the ground at the time when a ground fault occurs in the load interconnection is 100Ω. These numerical values are merely by way of example, and the present invention is not limited thereto. In this case, the resonance frequency of resonance circuit 21 is calculated as 30 Hz. In other words, the resonance frequency of resonance circuit 21 is different from the frequency of AC voltage V.

The resistance value described corresponding to each element shows an impedance at the frequency of 30 Hz. The resistance values of inductor $L_{E1}$, capacitor $C_{E1}$ and floating capacitor $C_L$ each show an imaginary-axis component of the complex impedance while the resistance values of loads 12 to 14 each show a real-axis component of the complex impedance.

When a ground fault does not occur in load interconnection LT5, the resistance value of insulation resistance $R_E$ between load interconnection LT5 and the ground is extremely high. Accordingly, the current hardly flows through ground fault detection circuit 10. On the other hand, when a ground fault occurs in load interconnection LT5, the resistance value of insulation resistance $R_E$ is decreased. Accordingly, the current flowing through ground fault detection circuit 10 is increased. A ground fault is detected by an increase in the current flowing through ground fault detection circuit 10.

Figure 12:
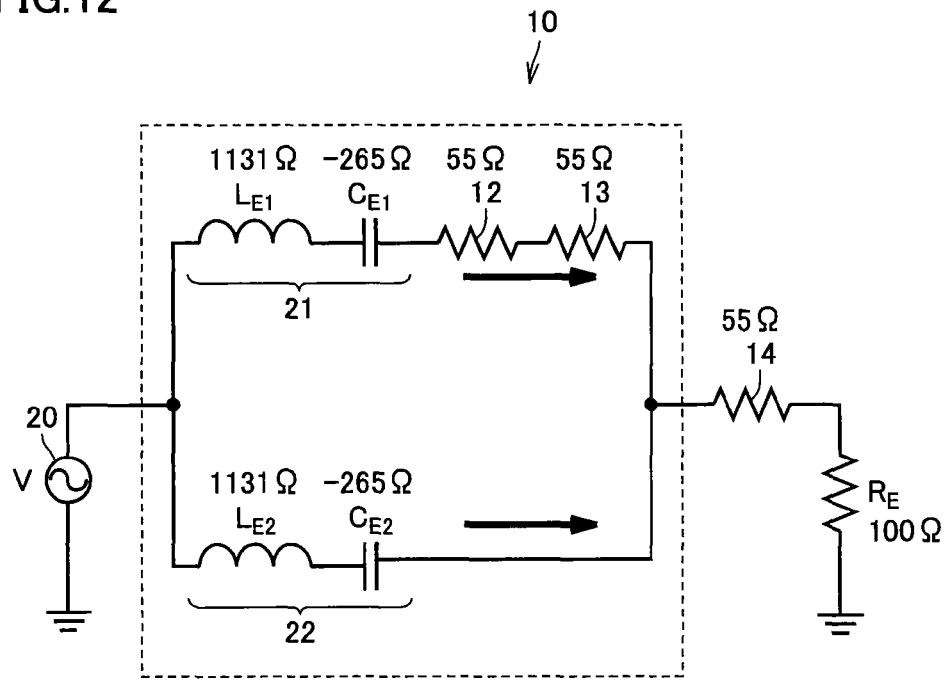
FIG. 12 is a diagram equivalently showing a ground fault detection circuit 10 in the state where a ground fault occurs in load interconnection LT5.
Figure 13:
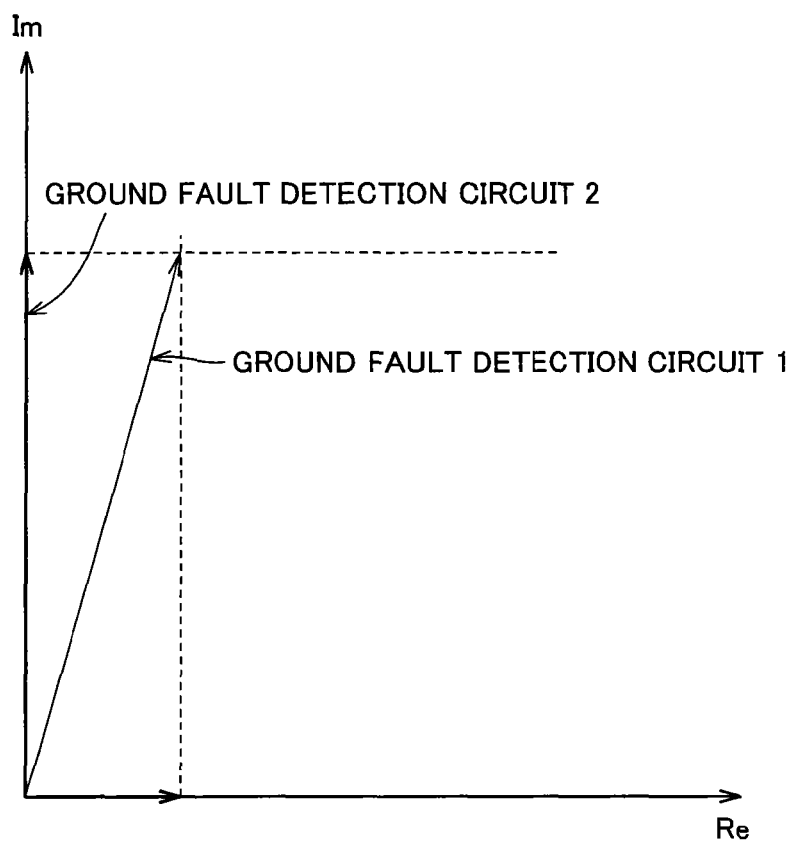
FIG. 13 is a diagram illustrating the impedance of a portion of the configuration shown in FIG. 12 that is surrounded by a dashed line.

FIG. 12 is a diagram equivalently showing ground fault detection circuit 10 in the state where a ground fault occurs in load interconnection LT5. FIG. 13 is a diagram illustrating the impedance of a portion of the configuration shown in FIG. 12 that is surrounded by a dashed line. Referring to FIGS. 12 and 13, resonance circuits 21 and 22 have the same configuration. According to the above example, the capacitance values of capacitors $C_{E1}$ and $C_{E2}$ each are 10 μF while the inductance values of inductors $L_{E1}$ and $L_{E2}$ each are 3 H. Therefore, the resonance frequency of each of resonance circuits 21 and 22 is about 30 Hz.

A "ground fault detection circuit 1" and a "ground fault detection circuit 2" shown in FIG. 13 correspond to resonance circuits 21 and 22, respectively. As shown in FIG. 13, when the resonance frequency of each resonance circuit is different from the frequency of the AC power supply, the impedance of the imaginary-axis (Im) component reaches a value much higher than the impedance of the real-axis (Re) component, that is, the impedance of the load.

In other words, FIG. 13 shows that the current value of each of resonance circuits 21 and 22 does not significantly change even if a ground fault occurs. Accordingly, it is considered difficult to detect the position of a ground fault based on the current.

As described above, according to the configuration shown in FIG. 9, although it may be possible to detect whether a ground fault occurs or not, the position of a ground fault cannot be identified. Therefore, in order to identify the position of a ground fault based on the configuration shown in FIG. 9, it is necessary to stop power supply device 100 temporarily and then check all of the loads. This however also requires a restart of power supply device 100. This restart of power supply device 100 requires a certain amount of time, which becomes a problem.

On the other hand, according to the embodiment of the present invention, it is possible not only to detect whether a ground fault occurs or not, but also to identify the position where a ground fault occurs. Furthermore, power supply device 100 does not need to be stopped for identifying the position of a ground fault. Furthermore, since the number of AC power supplies used for detecting a ground fault is one, the configuration of the ground fault detection circuit can be prevented from being complicated.

The ground fault detection circuit according to the embodiment of the present invention will be hereinafter described in detail.

Figure 14:
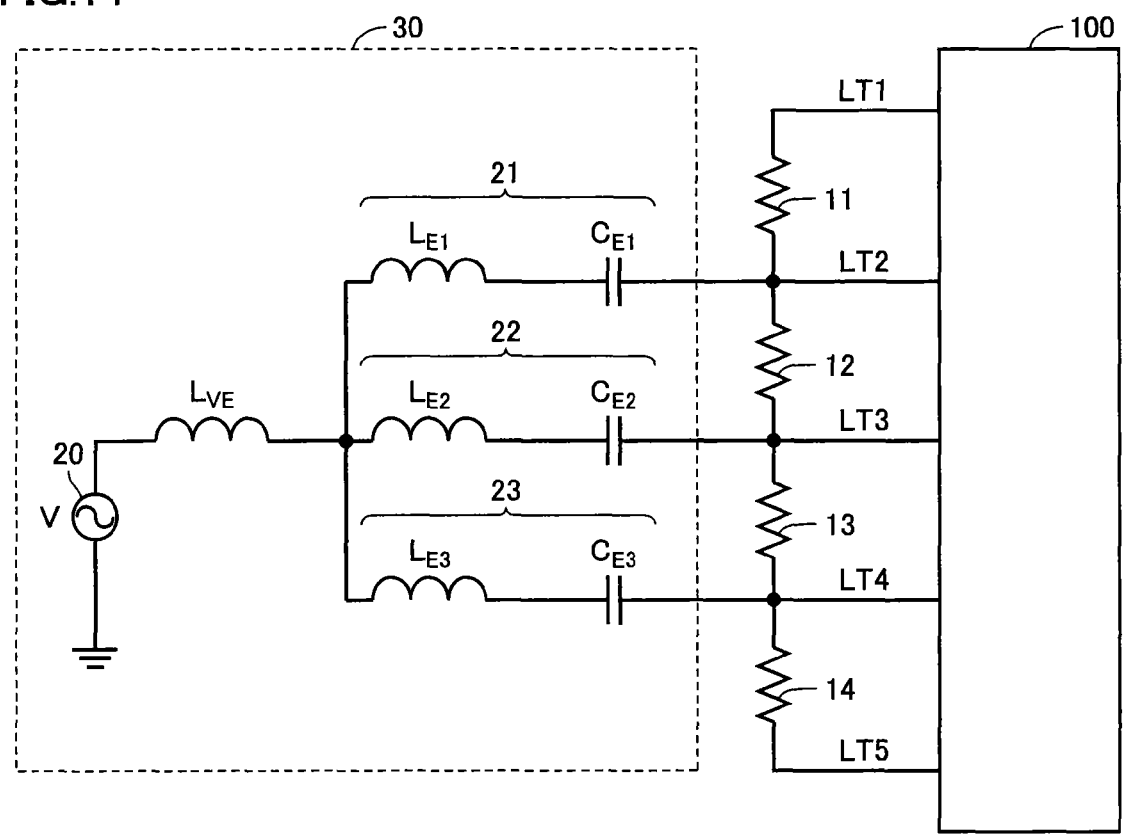
FIG. 14 is a configuration diagram of the ground fault detection circuit according to the embodiment of the present invention.

FIG. 14 is a configuration diagram of the ground fault detection circuit according to the embodiment of the present invention. Referring to FIG. 14, a ground fault detection circuit 30 includes an AC power supply 20 generating an AC voltage V, resonance circuits 21 to 23, and an inductor $L_{VE}$.

Each of resonance circuits 21 to 23 is connected to a current path formed of loads 11 to 14. Furthermore, resonance circuits 21 to 23 are connected in parallel to AC power supply 20 through inductor $L_{VE}$.

Resonance circuit 21 includes an inductor $L_{E1}$ and a capacitor $C_{E1}$ connected in series between inductor $L_{VE}$ and load interconnection LT2. Resonance circuit 22 includes an inductor $L_{E2}$ and a capacitor $C_{E2}$ connected in series between inductor $L_{VE}$ and load interconnection LT3. Resonance circuit 23 includes an inductor $L_{E3}$ and a capacitor $C_{E3}$ connected in series between inductor $L_{VE}$ and load interconnection LT4. Inductor $L_{VE}$ serves as an inductor for limiting a current. Inductors $L_{E1}$, $L_{E2}$ and $L_{E3}$ each serve as an inductor for detecting a ground fault. Capacitors $C_{E1}$, $C_{E2}$ and $C_{E3}$ each serve as a capacitor for detecting a ground fault.

In terms of the basic operation principle and the method of detecting a ground fault, ground fault detection circuit 30 is the same as ground fault detection circuit 10 shown in FIG. 9. In other words, it can be detected based on the current flowing through ground fault detection circuit 30 whether a ground fault occurs or not.

Figure 15:
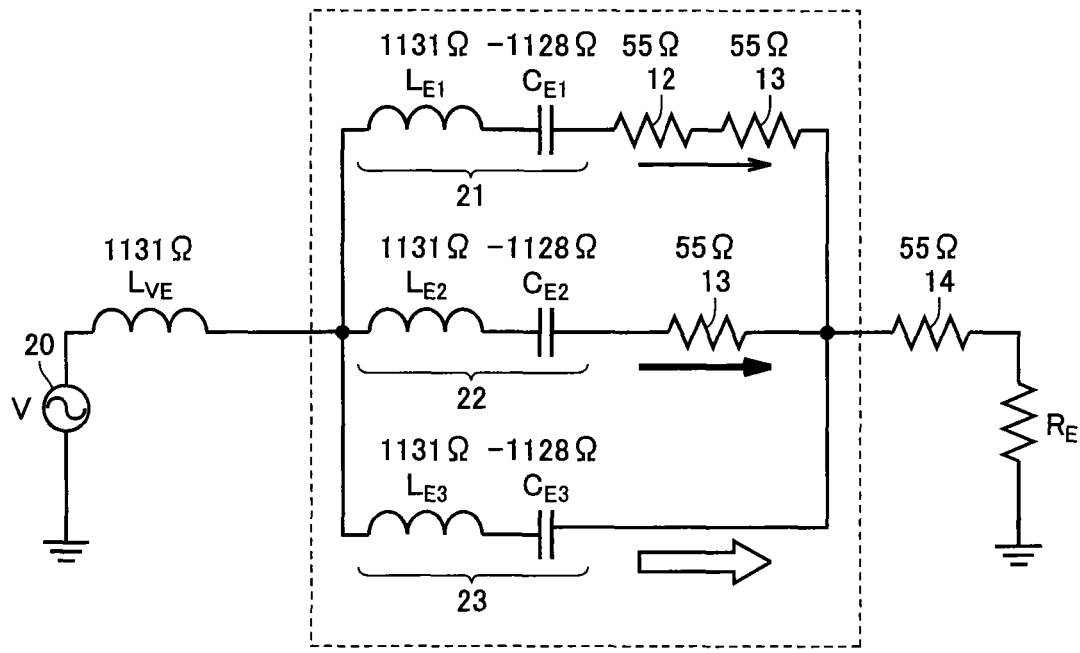
FIG. 15 is a circuit diagram equivalently showing a ground fault detection circuit 30 in the state where a ground fault occurs in load interconnection LT5.
Figure 16:
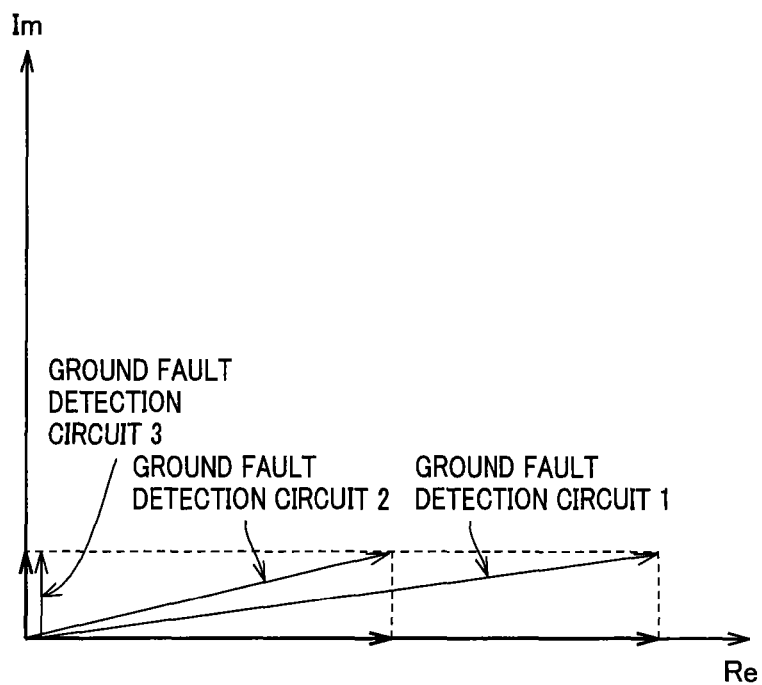
FIG. 16 is a diagram illustrating the impedance of a portion of the configuration shown in FIG. 15 that is surrounded by a dashed line.

FIG. 15 is a circuit diagram equivalently showing ground fault detection circuit 30 in the state where a ground fault occurs in load interconnection LT5. FIG. 16 is a diagram illustrating the impedance of a portion of the configuration shown in FIG. 15 that is surrounded by a dashed line. Referring to FIGS. 15 and 16, resonance circuits 21, 22 and 23 have the same configuration. For example, the capacitance values of capacitors $C_{E1}$, $C_{E2}$ and $C_{E3}$ each are 2.35 μF; the inductance values of inductors $L_{E1}$, $L_{E2}$ and $L_{E3}$ each are 3H; and the inductance value of inductor $L_{VE}$ is 3 H. Furthermore, the resistance value of insulation resistance $R_E$ during a ground fault is 100Ω; and the resistance values of loads 12, 13 and 14 each are 55Ω. The resonance frequencies of resonance circuits 21 to 23 in this case each are 60 Hz. The frequency of AC voltage V is also 60 Hz. In other words, in the embodiment of the present invention, the resonance frequencies of resonance circuits 21 to 23 each are equal to the frequency of the AC power supply.

The resistance value indicated above each element shows an impedance at a frequency of 60 Hz. The resistance values indicated above inductors $L_{VE}$, $L_{E1}$, $L_{E2}$, and $L_{E3}$ each show an imaginary-axis component of the complex impedance, and the resistance values indicated above loads 12 to 14 each show a real-axis component of the complex impedance.

Resonance circuit 21 is connected to loads 12, 13, and 14 and insulation resistance $R_E$. Resonance circuit 22 is connected to loads 13, 14 and insulation resistance $R_E$. Resonance circuit 23 is connected to load 14 and insulation resistance $R_E$. Therefore, the magnitude of the impedance of the load resistance varies among resonance circuits 21 to 23. Furthermore, since the resonance frequency of each of resonance circuits 21 to 23 is equal to the frequency of AC power supply 20, the imaginary-axis component of the complex impedance of each of resonance circuits 21 to 23 is reduced. Therefore, as shown in FIG. 16, the complex impedance varies in accordance with the impedance of the load resistance. "Ground fault detection circuit 1", "ground fault detection circuit 2" and "ground fault detection circuit 3" shown in FIG. 16 correspond to resonance circuits 21, 22 and 23, respectively.

According to the embodiment of the present invention, the complex impedance varies in accordance with the impedance of the load resistance. Accordingly, the current flowing through the resonance circuit is dependent on the impedance of the load resistance. As shown in FIG. 15, when a ground fault occurs in load interconnection LT5, the largest current flows through the resonance circuit located closest to the position where a ground fault occurs, and the smallest current flows through the resonance circuit in the detection circuit located farthest from this position where a ground fault occurs. In other words, in ascending order, resonance circuit 21 has the smallest current value, resonance circuit 22 has the second smallest current value, and resonance circuit 23 has the largest current value. For the reasons as set forth above, a ground fault can be detected based on the current value of each of resonance circuit 23, resonance circuit 22 and resonance circuit 21.

Also when a ground fault occurs in any of load interconnections LT1 and LT2, in descending order, resonance circuit 21 has the largest current value, resonance circuit 22 has the second largest current value, and resonance circuit 23 has the smallest current value. Similarly, also when a ground fault occurs in any of load interconnections LT4 and LT5, in descending order, resonance circuit 23 has the largest current value, resonance circuit 22 has the second largest current value, and resonance circuit 21 has the smallest current value. Therefore, it is difficult to identify the position of a ground fault only by the current value. Therefore, according to the embodiment of the present invention, the position of a ground fault is identified based on the current flowing through each of resonance circuits 21 to 23 and the voltage between the ground and each of load interconnections LT1 to LT5 (that is, the voltage on each of loads 11 to 14).

The method of identifying the position of a ground fault will be hereinafter described for each mode.

(Mode A)

Figure 17:
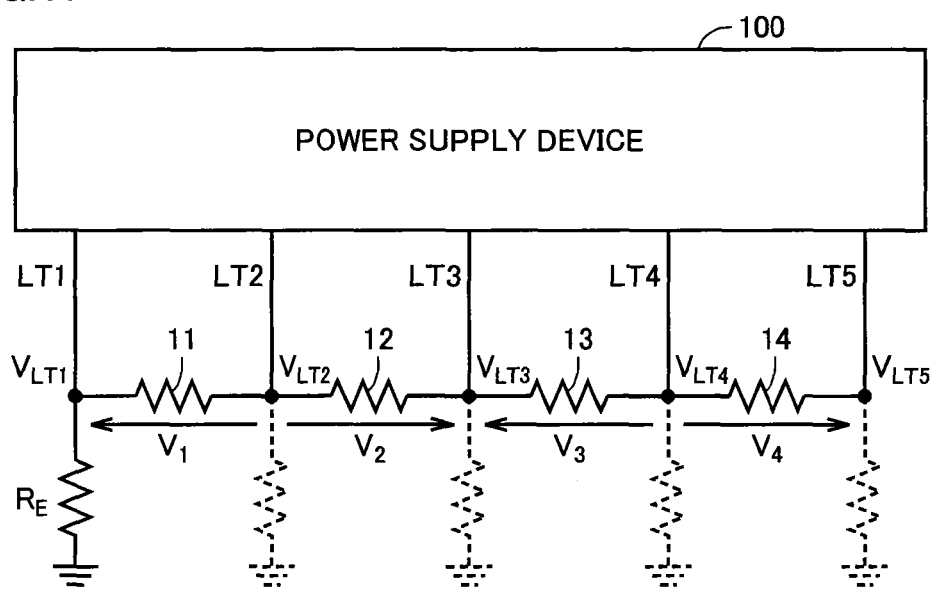
FIG. 17 is a diagram for illustrating voltages $V_{LT1}$ to $V_{LT5}$ of load interconnections LT1 to LT5, respectively, in mode A.
Figure 18:
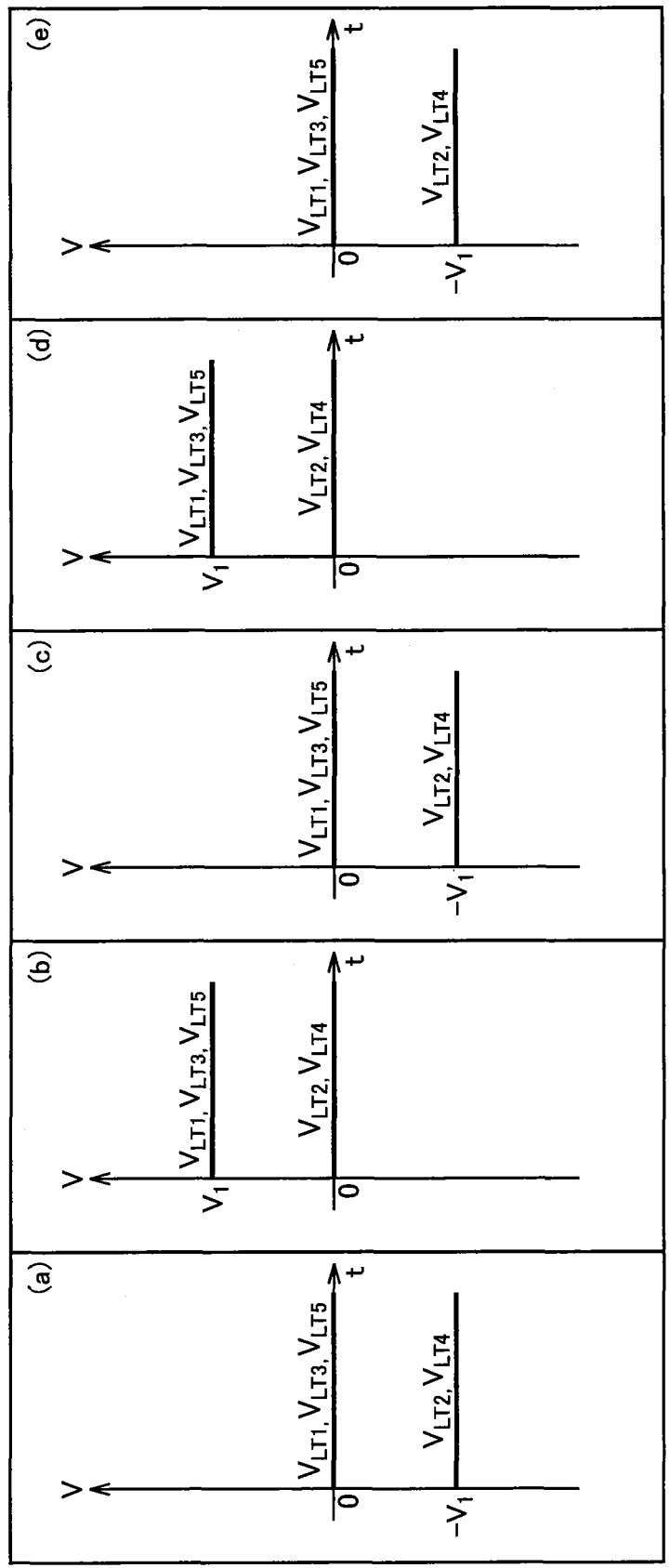
FIG. 18 is a diagram for illustrating voltages $V_{LT1}$ to $V_{LT5}$ at the time when a ground fault occurs in any of load interconnections LT1 to LT5.

FIG. 17 is a diagram for illustrating voltages $V_{LT1}$ to $V_{LT5}$ of load interconnections LT1 to LT5, respectively, in mode A. FIG. 18 is a diagram for illustrating voltages $V_{LT1}$ to $V_{LT5}$ at the time when a ground fault occurs in any of load interconnections LT1 to LT5. Referring to FIGS. 17 and 18, voltages $V_{LT1}$ to $V_{LT5}$ are defined as voltages on load interconnections LT1 to LT5, respectively, to the ground. FIGS. 18(a) to 18(e) show voltages $V_{LT1}$ to $V_{LT5}$ at the time when a ground fault occurs in load interconnections LT1 to LT5. For example, the state where a ground fault occurs in load interconnection LT1 corresponds to the state where the resistance value of insulation resistance $R_E$ existing between load interconnection LT1 and the ground is decreased.

When a ground fault occurs in load interconnection LT1, voltages $V_{LT1}$, $V_{LT3}$ and $V_{LT5}$ each are 0, and voltages $V_{LT2}$ and $V_{LT4}$ each are $-V_1$ (FIG. 18(a)). In this case, in descending order, resonance circuit 21 has the largest current value, resonance circuit 22 has the second largest current value, and resonance circuit 23 has the smallest current value.

When a ground fault occurs in load interconnection LT2, voltages $V_{LT1}$, $V_{LT3}$ and $V_{LT5}$ each are $V_1$, and voltages $V_{LT2}$ and $V_{LT4}$ each are 0 (FIG. 18(b)). In this case, in descending order, resonance circuit 21 has the largest current value, resonance circuit 22 has the second largest current value, and resonance circuit 23 has the smallest current value.

When a ground fault occurs in load interconnection LT3, voltages $V_{LT1}$, $V_{LT3}$ and $V_{LT5}$ each are 0, and voltages $V_{LT2}$ and $V_{LT4}$ each are $-V_1$ (FIG. 18(c)). In this case, the current value of resonance circuit 22 is greater than those of resonance circuits 21 and 23. In addition, it is considered that the current value of resonance circuit 21 is equal to the current value of resonance circuit 23.

When a ground fault occurs in load interconnection LT4, voltages $V_{LT1}$, and $V_{LT5}$ each are $V_1$, and voltages $V_{LT2}$ and $V_{LT4}$ each are 0 (FIG. 18(d)). In this case, in descending order, resonance circuit 23 has the largest current value, resonance circuit 22 has the second largest current value, and resonance circuit 21 has the smallest current value.

When a ground fault occurs in load interconnection LT5, voltages $V_{LT1}$, $V_{LT3}$ and $V_{LT5}$ each are 0, and voltages $V_{LT2}$ and $V_{LT4}$ each are $-V_1$ (FIG. 18(e)). In this case, in descending order, resonance circuit 23 has the largest current value, resonance circuit 22 has the second largest current value, and resonance circuit 21 has the smallest current value.

As described above, between the time when a ground fault occurs in load interconnection LT1 and the time when a ground fault occurs in load interconnection LT2, the order of magnitude of the current values among resonance circuits 21 to 23 is the same while the values of voltages $V_{LT1}$ to $V_{LT5}$ are different. Therefore, it can be detected based on the combination of the current values and the voltage values whether a ground fault occurs in load interconnection LT1 or LT2. The same applies to load interconnections LT4 and LT5. Furthermore, between the time when a ground fault occurs in load interconnection LT3 and the time when a ground fault occurs in load interconnection LT1 or LT5, voltages $V_{LT1}$ to $V_{LT5}$ are the same while the currents flowing through resonance circuits 21 to 23 are different. Therefore, a ground fault in load interconnection LT3 can be detected based on the current values and the voltage values.

(Mode B)

Figure 19:
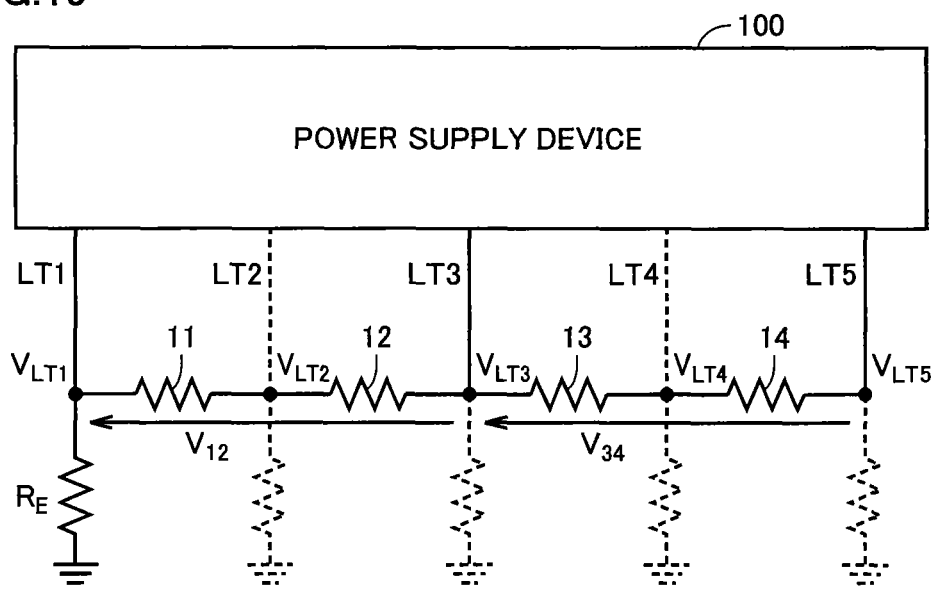
FIG. 19 is a diagram for illustrating voltages $V_{LT1}$ to $V_{LT5}$ of load interconnections LT1 to LT5, respectively, in mode B.
Figure 20:
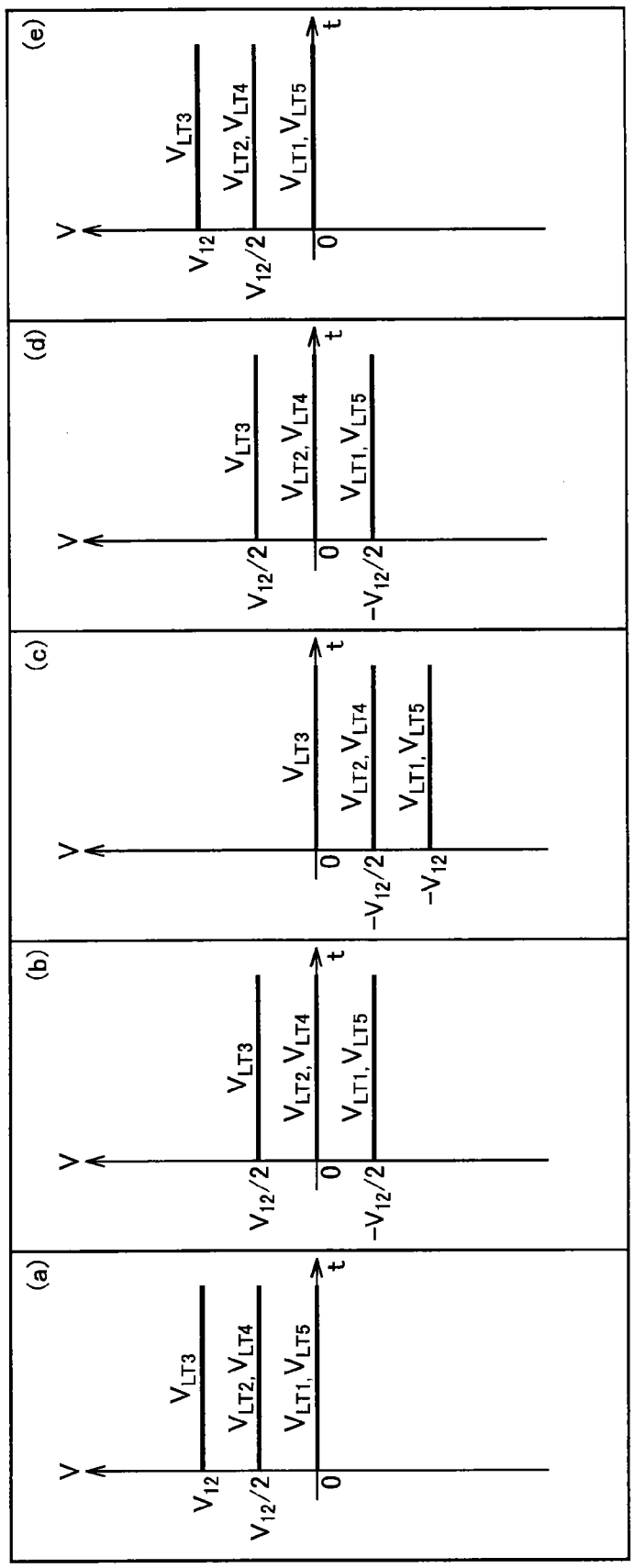
FIG. 20 is a diagram for illustrating voltages $V_{LT1}$ to $V_{LT5}$ at the time when a ground fault occurs in any of load interconnections LT1 to LT5.

FIG. 19 is a diagram for illustrating voltages $V_{LT1}$ to $V_{LT5}$ of load interconnections LT1 to LT5, respectively, in mode B. FIG. 20 is a diagram for illustrating voltages $V_{LT1}$ to $V_{LT5}$ at the time when a ground fault occurs in any of load interconnections LT1 to LT5. Referring to FIGS. 19 and 20, voltages $V_{LT1}$ to $V_{LT5}$ are the same as voltages $V_{LT1}$ to $V_{LT5}$ shown in FIG. 17. FIGS. 20(a) to 20(e) show voltages $V_{LT1}$ to $V_{LT5}$ at the time when a ground fault occurs in load interconnections LT1 to LT5.

When a ground fault occurs in load interconnection LT1, a voltage $V_{LT3}$ is $V_{12}$, voltages $V_{LT2}$ and $V_{LT4}$ each are $V_{12}/2$, and voltages $V_{LT1}$ and $V_{LT5}$ each are 0 (FIG. 20(a)). In this case, in descending order, resonance circuit 21 has the largest current value, resonance circuit 22 has the second largest current value, and resonance circuit 23 has the smallest current value.

When a ground fault occurs in load interconnection LT2, a voltage $V_{LT3}$ is $V_{12}/2$, voltages $V_{LT2}$ and $V_{LT4}$ each are 0, and voltages $V_{LT1}$ and $V_{LT5}$ each are $-V_{12}/2$ (FIG. 20(b)). In this case, in descending order, resonance circuit 21 has the largest current value, resonance circuit 22 has the second largest current value, and resonance circuit 23 has the smallest current value.

When a ground fault occurs in load interconnection LT3, a voltage $V_{LT3}$ is 0, voltages $V_{LT2}$ and $V_{LT4}$ each are $-V_{12}/2$, and voltages $V_{LT1}$ and $V_{LT5}$ each are $-V_{12}$ (FIG. 20(c)). In this case, the current value of resonance circuit 22 is greater than the current value of each of resonance circuits 21 and 23. In addition, it is considered that the current value of resonance circuit 21 is equal to the current value of resonance circuit 23.

When a ground fault occurs in load interconnection LT4, a voltage $V_{LT3}$ is $V_{12}/2$, voltages $V_{LT2}$ and $V_{LT4}$ each are 0, and voltages $V_{LT1}$ and $V_{LT5}$ each are $-V_{12}/2$ (FIG. 20(d)). In this case, in descending order, resonance circuit 23 has the largest current value, resonance circuit 22 has the second largest current value, and resonance circuit 21 has the smallest current value.

When a ground fault occurs in load interconnection LT5, a voltage $V_{LT3}$ is $V_{12}$, voltages $V_{LT2}$ and $V_{LT4}$ each are $V_{12}/2$, and voltages $V_{LT1}$ and $V_{LT5}$ each are 0 (FIG. 20(e)). In this case, in descending order, resonance circuit 23 has the largest current value, resonance circuit 22 has the second largest current value, and resonance circuit 21 has the smallest current value.

As in the case of mode A, between the time when a ground fault occurs in load interconnection LT1 and the time when a ground fault occurs in load interconnection LT2, the order of magnitude of the current values among resonance circuits 21 to 23 is the same while voltages $V_{LT1}$ to $V_{LT5}$ are different. Therefore, it can be detected whether a ground fault occurs in load interconnection LT1 or LT2. The same applies to load interconnections LT4 and LT5. Furthermore, voltages $V_{LT1}$ to $V_{LT5}$ at the time when a ground fault occurs in load interconnection LT3 are different from voltages $V_{LT1}$ to $V_{LT5}$ at the time when a ground fault occurs in any one of load interconnections LT1, LT2, LT4, and LT5. Therefore, a ground fault in load interconnection LT3 can be detected. In this way, the position of a ground fault can be identified by the combination of values of voltages $V_{LT1}$ to $V_{LT5}$ and the currents flowing through resonance circuits 21 to 23.

(Mode C)

Figure 21:
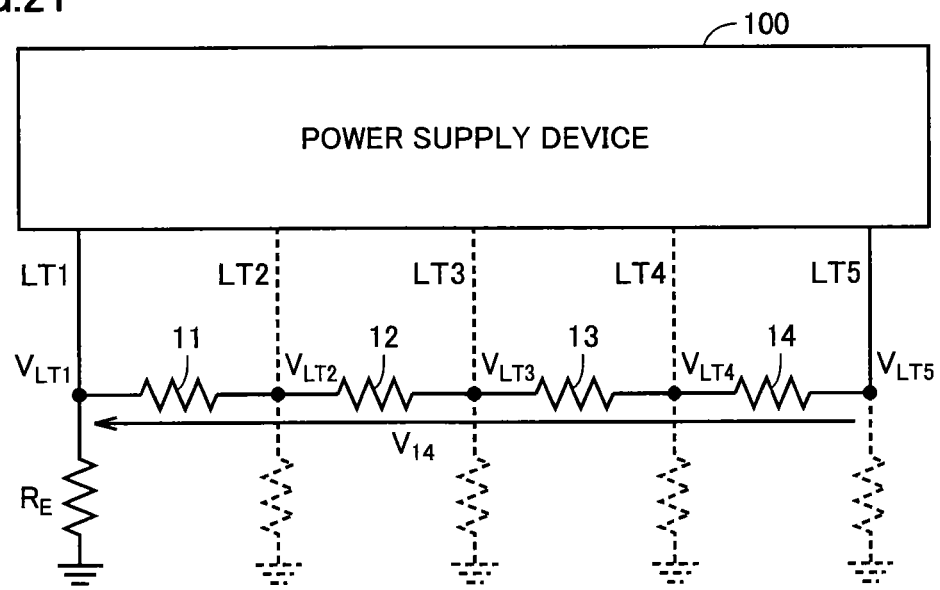
FIG. 21 is a diagram for illustrating voltages $V_{LT1}$ to $V_{LT5}$ of load interconnections LT1 to LT5, respectively, in mode C.
Figure 22:
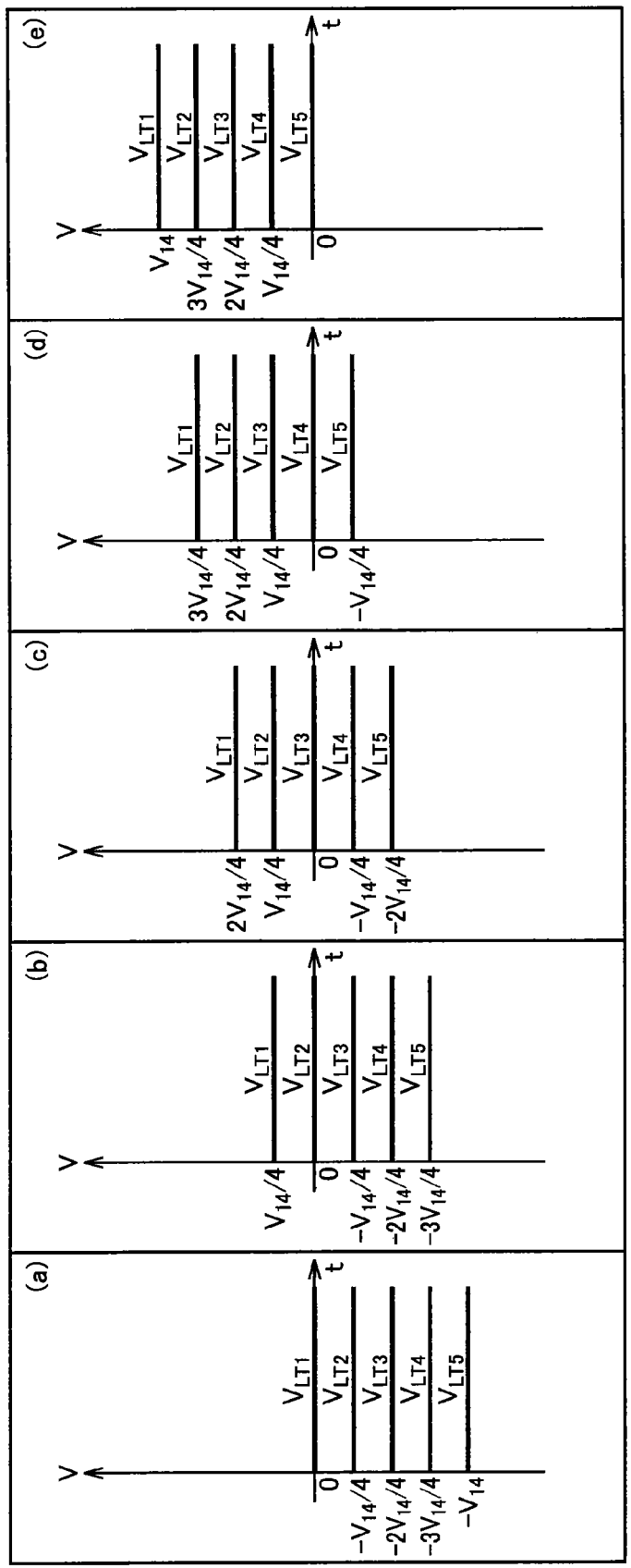
FIG. 22 is a diagram for illustrating voltages $V_{LT1}$ to $V_{LT5}$ at the time when a ground fault occurs in any of load interconnections LT1 to LT5.

FIG. 21 is a diagram for illustrating voltages $V_{LT1}$ to $V_{LT5}$ of load interconnections LT1 to LT5, respectively, in mode C. FIG. 22 is a diagram for illustrating voltages $V_{LT1}$ to $V_{LT5}$ at the time when a ground fault occurs in any of load interconnections LT1 to LT5. Referring to FIGS. 21 and 22, voltages $V_{LT1}$ to $V_{LT5}$ are the same as voltages $V_{LT1}$ to $V_{LT5}$ shown in FIG. 17. FIGS. 22(a) to 22(e) show voltages $V_{LT1}$ to $V_{LT5}$ at the time when a ground fault occurs in load interconnections LT1 to LT5.

When a ground fault occurs in load interconnection LT1, voltages $V_{LT1}$, $V_{LT2}$, $V_{LT3}$, $V_{LT4}$, and $V_{LT5}$ are 0, $-V_{14}/4$, $-2V_{14}/4$, $-3V_{14}/4$, and $-V_{14}$, respectively (FIG. 22(a)).

When a ground fault occurs in load interconnection LT2, voltages $V_{LT1}$, $V_{LT2}$, $V_{LT3}$, $V_{LT4}$, and $V_{LT5}$ are $V_{14}/4$, 0, $-V_{14}/4$, $-2V_{14}/4$, and $-3V_{14}/4$, respectively (FIG. 22(b)).

When a ground fault occurs in load interconnection LT3, voltages $V_{LT1}$, $V_{LT2}$, $V_{LT3}$, $V_{LT4}$, and $V_{LT5}$ are $2V_{14}/4$, $V_{14}/4$, 0, $-V_{14}/4$, and $-2V_{14}/4$, respectively (FIG. 22(c)).

When a ground fault occurs in load interconnection LT4, voltages $V_{LT1}$, $V_{LT2}$, $V_{LT3}$, $V_{LT4}$, and $V_{LT5}$ are $3V_{14}/4$, $2V_{14}/4$, $V_{14}/4$, 0, and $-V_{14}/4$, respectively (FIG. 22(d)).

When a ground fault occurs in load interconnection LT5, voltages $V_{LT1}$, $V_{LT2}$, $V_{LT3}$, $V_{LT4}$, and $V_{LT5}$ are $V_{14}$, $3V_{14}/4$, $2V_{14}/4$, $V_{14}/4$, and 0, respectively (FIG. 22(e)). In the case of mode C, voltages $V_{LT1}$, $V_{LT2}$, $V_{LT3}$, $V_{LT4}$, and $V_{LT5}$ change in accordance with the position where a ground fault occurs. Therefore, the position of a ground fault can be identified based on voltages $V_{LT1}$, $V_{LT2}$, $V_{LT3}$, $V_{LT4}$, and $V_{LT5}$.

Figure 23:
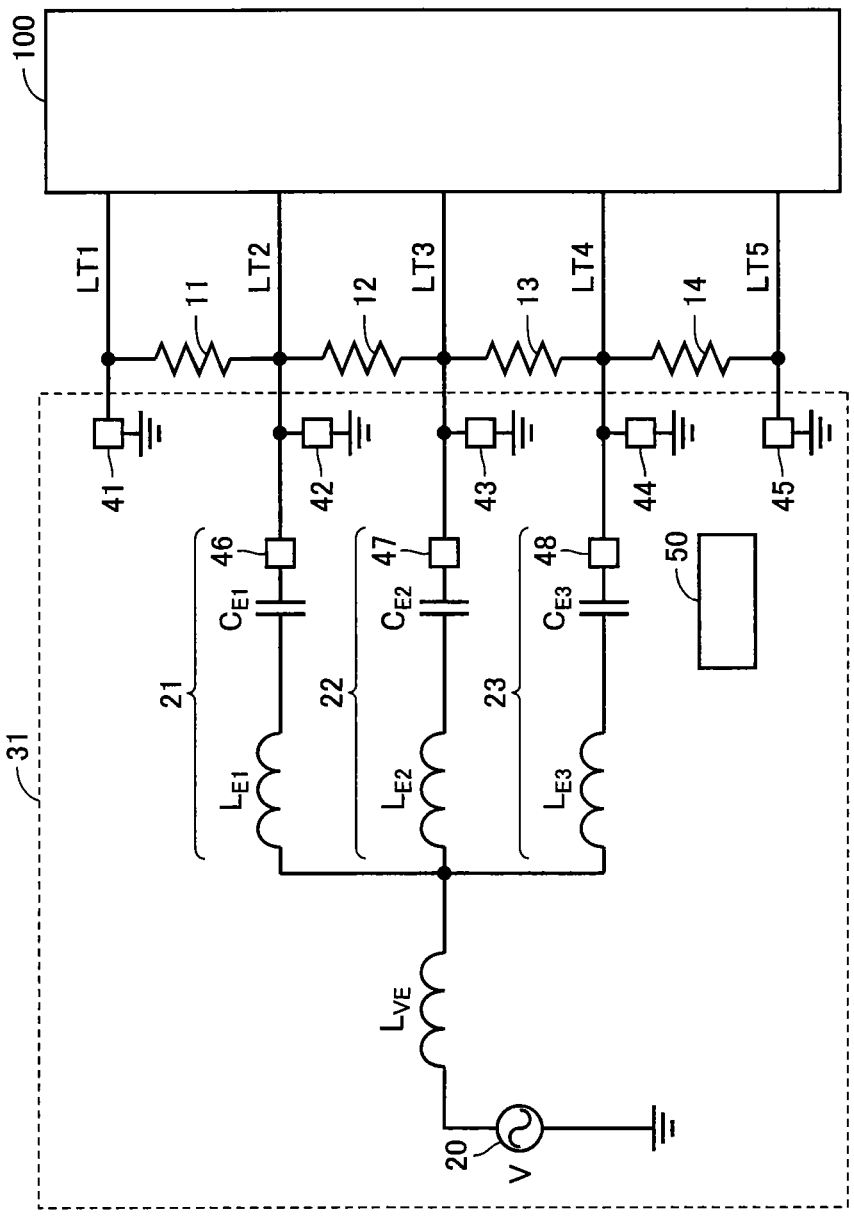
FIG. 23 is a diagram showing another configuration example of a ground fault detection circuit according to the embodiment of the present invention.

FIG. 23 is a diagram showing another configuration example of the ground fault detection circuit according to the embodiment of the present invention. Referring to FIGS. 14 and 23, a ground fault detection circuit 31 is different from ground fault detection circuit 30 in that it additionally includes voltage detectors 41 to 45, current detectors 46 to 48, and a ground fault monitoring unit 50. Voltage detectors 41 to 45 detect voltages on load interconnections LT1 to LT5 (voltages $V_{LT1}$ to $V_{LT5}$), respectively. Current detectors 46 to 48 detect currents flowing through resonance circuits 21 to 23, respectively. Ground fault monitoring unit 50 receives a voltage value from each of voltage detectors 41 to 45 and receives a current value from each of current detectors 46 to 48. Based on each voltage value and each current value, ground fault monitoring unit 50 detects whether a ground fault occurs or not. When a ground fault further occurs, ground fault monitoring unit 50 identifies the position where a ground fault occurs. Ground fault monitoring unit 50 can be implemented by a microcomputer, for example. In addition, ground fault monitoring unit 50 may automatically distinguish the mode of power supply device 100, or may distinguish the mode of power supply device 100 by receiving the information about the mode of power supply device 100.

Ground fault monitoring unit 50 identifies the position of a ground fault in accordance with the method corresponding to each of modes A to C as described above. In other words, ground fault monitoring unit 50 identifies the position of a ground fault based on the combination of voltages $V_{LT1}$ to $V_{LT5}$ and the current flowing through each of resonance circuits 21 to 23. It is to be noted that ground fault monitoring unit 50 may be omitted.

As described above, according to the embodiment of the present invention, the resonance frequency of the resonance circuit is set to be equal to the frequency of the AC power supply. Furthermore, the resonance circuit is connected to the point to which two loads are connected. Accordingly, the position of a ground fault can be identified based on the voltage at this connection point and the current flowing through the resonance circuit.

Further, according to the embodiment of the present invention, one AC power supply is provided in common for a plurality of resonance circuits. According to the embodiment of the present invention, it becomes possible to prevent complication of the configuration for detecting the position of a ground fault. Therefore, the position of a ground fault can be detected in a simple configuration.

In addition, the number of loads is not limited to four as long as more than one load is provided. In the case where m (m is two or more) loads are connected in series, the number of connection points to which two loads are connected is (m−1). In the present invention, the ground fault detection circuit only has to include (m−1) resonance circuits. The resonance frequency of each of (m−1) resonance circuits is set to be equal to the resonance frequency of the AC power supply. Therefore, the number of loads may be, for example, greater than four.

Furthermore, the configuration and the operation mode of the power supply device are not limited to the configuration and the operation mode described above, but may be modified in various manners.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1 transformer, 2 rectifier, 4, 5 current limiting circuit, 10, 30, 31 ground fault detection circuit, 11 to 14 load, 20 AC power supply, 21 to 23 resonance circuit, 41 to 45 voltage detector, 46 to 48 current detector, 50 ground fault monitoring unit, $C_{E1}$ to $C_{E3}$ capacitor (for detecting a ground fault), $C_L$ floating capacitor, L1 to L9 saturable reactor, $L_{E1}$ to $L_{E3}$ inductor (for detecting a ground fault), $L_{VE}$ inductor (for limiting a current), LT1 to LT5 load interconnection, $R_E$ insulation resistance, TB1 to TB4 thyristor rectifier circuit, TS1 to TS9 thyristor switch.

The invention claimed is:

1. A ground fault detection circuit for detecting a ground fault in a plurality of loads each connected to a power supply device, said ground fault detection circuit comprising:
   an AC power supply; and
   a plurality of resonance circuits connected between at least one current path formed of said plurality of loads and said AC power supply,
   each of said plurality of resonance circuits having a resonance frequency equal to a frequency of said AC power supply;
   each of said plurality of loads being connected to one of said plurality of resonance circuits; and
   the AC power supply applying a same signal to each of the plurality of resonance circuits.

2. The ground fault detection circuit according to claim 1, further comprising:
   a plurality of current detectors provided corresponding to said plurality of resonance circuits, respectively, for detecting a current flowing from said AC power supply via a corresponding resonance circuit of the plurality of resonance circuits through said at least one current path; and
   a plurality of voltage detectors provided corresponding to said plurality of loads, respectively, for detecting a voltage on a corresponding load of said plurality of loads.

3. A ground fault detection circuit for detecting a ground fault in a plurality of loads each connected to a power supply device, said ground fault detection circuit comprising:
   an AC power supply;
   a plurality of resonance circuits connected between at least one current path formed of said plurality of loads and said AC power supply,
   each of said plurality of resonance circuits having a resonance frequency equal to a frequency of said AC power supply;
   a plurality of current detectors provided corresponding to said plurality of resonance circuits, respectively, for detecting a current flowing from said AC power supply via a corresponding resonance circuit of the plurality of resonance circuits through said at least one current path; and
   a plurality of voltage detectors provided corresponding to said plurality of loads, respectively, for detecting a voltage on a corresponding load of said plurality of loads;
   wherein
   said power supply device includes a transformer,
      a plurality of rectifier circuits provided corresponding to said plurality of loads, respectively, and each connected to said transformer, and
      at least one semiconductor switch switching a mode of connection of said plurality of loads to at least one rectifier circuit of said plurality of rectifier circuits among a first mode, a second mode and a third mode,
   in said first mode, said plurality of loads are connected in parallel to said at least one rectifier circuit,
   in said second mode, said plurality of loads are connected in series and parallel to said at least one rectifier circuit, and
   in said third mode, said plurality of loads are connected in series to said at least one rectifier circuit.

4. The ground fault detection circuit according to claim 3, further comprising a ground fault monitoring unit configured to identify a position of a ground fault by using said current detected by each of said plurality of current detectors and said voltage of said corresponding load detected by said plurality of voltage.

5. The ground fault detection circuit according to claim 4, wherein
   said plurality of loads are first to fourth loads,
   in said second mode, said first and second loads are connected in series, and said third and fourth loads are connected in series,
   in said third mode, said first to fourth loads are connected in series, and said plurality of resonance circuits include
      a first resonance circuit connected to a connection point of said first load and said second load,
      a second resonance circuit connected to a connection point of said second load and said third load, and
      a third resonance circuit connected to a connection point of said third load and said fourth load.

6. The ground fault detection circuit according to claim 5, wherein
   said ground fault monitoring unit is configured to identify the position of a ground fault based on a current flowing through each of said first to third resonance circuits and a voltage on each of said first to fourth loads in each of said first and second modes, and to identify the position of a ground fault based on the voltage on each of said first to fourth loads in said third mode.

* * * * *